(12) United States Patent
Lai et al.

(10) Patent No.: US 9,810,990 B2
(45) Date of Patent: Nov. 7, 2017

(54) CHEMICAL TREATMENT FOR LITHOGRAPHY IMPROVEMENT IN A NEGATIVE TONE DEVELOPMENT PROCESS

(71) Applicant: TAIWAN SEMICONDUCTOR MANUFACTURING COMPANY, LTD., Hsin-Chu (TW)

(72) Inventors: Wei-Han Lai, Hsin-Chu (TW); Ching-Yu Chang, Hsin-Chu (TW); Cheng-Han Wu, Hsin-Chu (TW); Siao-Shan Wang, Hsin-Chu (TW); Chin-Hsiang Lin, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 25 days.

(21) Appl. No.: 14/658,354

(22) Filed: Mar. 16, 2015

(65) Prior Publication Data
US 2016/0274463 A1    Sep. 22, 2016

(51) Int. Cl.
G03F 7/38 (2006.01)
G03F 7/32 (2006.01)
G03F 7/40 (2006.01)
G03F 7/038 (2006.01)

(52) U.S. Cl.
CPC ............ G03F 7/325 (2013.01); G03F 7/0382 (2013.01); G03F 7/38 (2013.01); G03F 7/40 (2013.01)

(58) Field of Classification Search
USPC ........................................................ 430/325
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2011/0165523 A1* | 7/2011 | Wang | G03F 7/422 430/331 |
| 2011/0229832 A1 | 9/2011 | Kamimura et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2016/0033869 A1* | 2/2016 | Hustad | G03F 7/325 438/761 |

FOREIGN PATENT DOCUMENTS

| | | | |
|---|---|---|---|
| JP | 2010243516 A | 10/2010 | |
| JP | 2010-265528 | * 11/2010 | ............ C23F 11/14 |
| TW | 201510678 | 3/2015 | |

OTHER PUBLICATIONS

Taiwanese Application No. 10521188610, Office Action mailed Sep. 26, 2016, 5 pgs.

* cited by examiner

Primary Examiner — Daborah Chacko Davis
(74) Attorney, Agent, or Firm — Haynes and Boone, LLP (57) ABSTRACT

A material layer is formed over a substrate. A negative tone photoresist layer is formed over the material layer. An exposure process is performed to the negative tone photoresist layer. A post-exposure bake (PEB) process is performed to the negative tone photoresist layer. After the exposure process and the PEB process, the negative tone photoresist layer is treated with a solvent. The solvent contains a chemical having a greater dipole moment than n-butyl acetate (n-BA).

20 Claims, 5 Drawing Sheets

CHEMICAL TREATMENT FOR LITHOGRAPHY IMPROVEMENT IN A NEGATIVE TONE DEVELOPMENT PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, negative tone development (NTD) processes may be needed to achieve the small device sizes. However, even NTD processes may still have drawbacks related to depth of focus (DOF), line width roughness (LWR), or scum. These issues degrade lithography performance and may lead to decreased yield or even device failures.

Therefore, while existing NTD processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor industry keeps shrinking device sizes (e.g., below 20 nanometer nodes), traditional positive tone development (PTD) processes face challenges related to optical restriction, which may lead to poor resolution. Therefore, negative tone development (NTD) processes have been used to pattern certain semiconductor elements such as contact holes or trenches. For NTD processes, a sufficiently good optical image may be achieved with bright filed mask application. However, although the lithography performance of NTD processes is typically better than PTD processes, NTD processes may still have certain shortcomings. For example, NTD processes may suffer from narrow depth of focus (DOF) problems due to unsatisfactory footing and tapper profile. As another example, NTD processes may result in poor line width roughness (LWR) due to large grain sizes. As yet another example, NTD processes may also cause too much scum to be generated, which is due to photoresist areas with poor optical contrast being too sensitive to increased acidity from the mask layer therebelow (e.g., Si-HM).

To overcome these issues associated with NTD processes discussed above, the present disclosure provides a novel chemical treatment of photoresist as a part of an improved NTD process. The various aspects of the present disclosure will be discussed below in greater detail with reference to FIGS. 1-5.

FIGS. 1-4 are diagrammatic fragmentary cross-sectional side views of a semiconductor device 35 at various stages of fabrication in accordance with various aspects of the present disclosure. The semiconductor device 35 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 1:
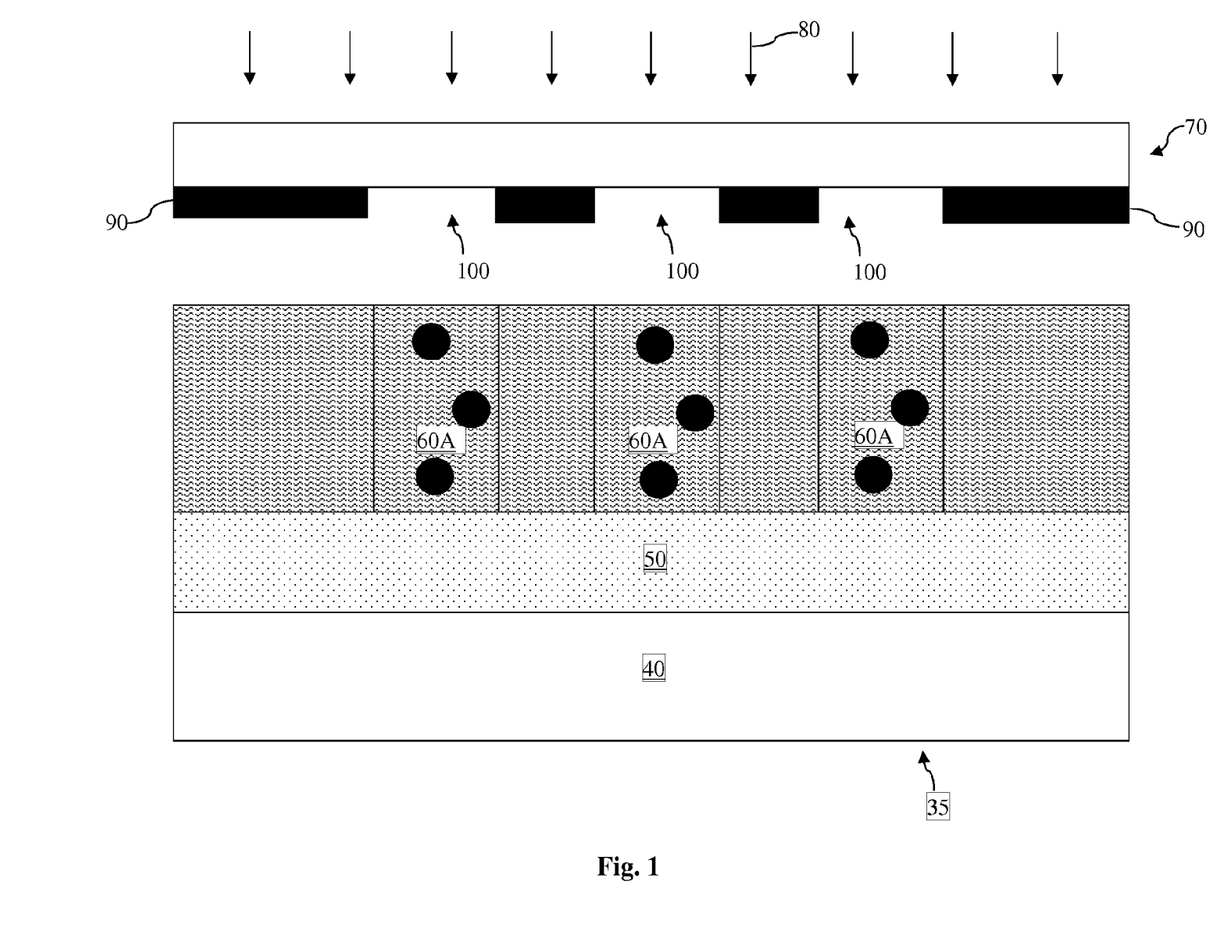
FIGS. 1-4 are diagrammatic cross-sectional side views of a semiconductor device at various stages of fabrication in accordance with some embodiments of the present disclosure.

Referring to FIG. 1, a semiconductor device 35 includes a substrate 40. In some embodiments, the substrate 40 is a silicon substrate doped with a p-type dopant such as boron (for example a p-type substrate). Alternatively, the substrate 40 could be another suitable semiconductor material. For example, the substrate 40 may be a silicon substrate that is doped with an n-type dopant such as phosphorous or arsenic (an n-type substrate). The substrate 40 could include other elementary semiconductors such as germanium and diamond. The substrate 40 could optionally include a compound semiconductor and/or an alloy semiconductor. Further, the substrate 40 could include an epitaxial layer (epi layer), may be strained for performance enhancement, and may include a silicon-on-insulator (SOI) structure.

In some embodiments, the substrate 40 is substantially conductive or semi-conductive. The electrical resistance may be less than about $10^3$ ohm-meter. In some embodiments, the substrate 40 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 40 may contain Ti, Al, Co, Ru, TiN, WN2, or TaN.

In some other embodiments, the substrate 40 contains a dielectric material with a dielectric constant in a range from about 1 to about 40. In some other embodiments, the substrate 40 contains Si, metal oxide, or metal nitride, where the formula is MXb, wherein M is a metal or Si, and X is N or O, and wherein "b" is in a range from about 0.4 to 2.5. For example, the substrate 40 may contain $SiO_2$, silicon nitride, aluminum oxide, hafnium oxide, or lanthanum oxide.

A material layer 50 is formed over the substrate 40. The material layer 50 can be patterned via a lithography process and as such may also be referred to as a patternable layer. It is understood that the material layer 50 may serve as a hard mask, which can be used to pattern layers underneath after its own pattern has been defined by a patterned photoresist (to be formed thereabove). Thus, the material layer 50 may be referred to as a Si hard mask (Si-HM). In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 40 and the material layer 50 may each include additional suitable material compositions in other embodiments. It is also understood that additional layers may be formed between the substrate 40 and the material layer 50, but they are not illustrated herein for reasons of simplicity.

A photoresist layer 60 is formed over the material layer 50. The photoresist layer 60 includes a negative tone photoresist (also referred to as negative photoresist). Compared to a positive tone photoresist, where the portion of the photoresist exposed to light becomes soluble to a developer solution, the portions of the negative tone photoresist exposed to light remains insoluble to the developer solution. In some embodiments, the photoresist layer 60 may be formed by a spin-coating process. The photoresist layer 60 may contain components such as a polymer, photo acid generators (PAG), solvent, quenchers, chromophore, surfactant, cross linker, etc.

An exposure process is performed to expose desired portions of the photoresist layer 60. As a part of the exposure process, a photomask 70 (or a reticle) is positioned above the photoresist layer 60. As an illumination source, radiation such as ultraviolet (UV) light 80 is projected toward the photomask 70 from above. In some embodiments, the UV light has an illumination wavelength substantially less than 250 nm and comprises at least one of: KrF, ArF, EUV, or E-beam.

The photomask 70 has opaque portions 90, which will block radiation such as the UV light 80. Between the opaque portions 90 are transparent regions 100, which allow the UV light 80 to propagate through toward the photoresist layer 60 and expose the portions 60A of the photoresist layer 60 underneath. As a result of the UV light exposure, the portions 60A become crosslinked/polymerized and more difficult to dissolve in a developer solution.

Figure 2:
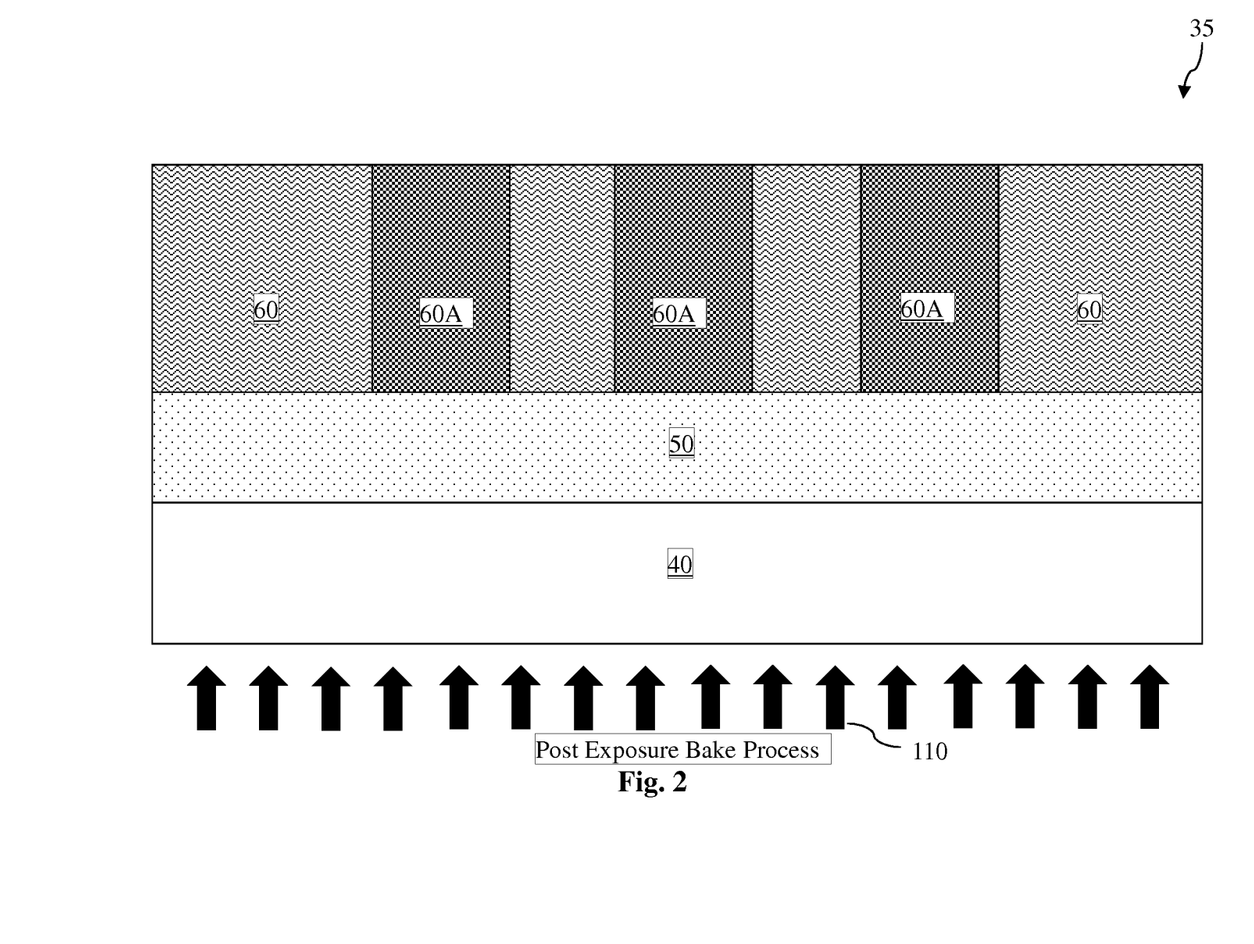

Referring now to FIG. 2, a post exposure bake process 110 is performed to the semiconductor device 35 after the exposure process. In some embodiments, the post exposure bake process 110 may be performed at a temperature range between about 100 degrees Celsius and about 120 degrees Celsius for several minutes. The post exposure bake process 110 catalytically performs and completes the photo reaction initiated inside the photoresist layer 60 during the exposure process. The post exposure bake process 110 also helps remove solvent from the photoresist layer 60. As a result, the adhesion and etching resistance of the photoresist layer 60 are improved.

Figure 3:
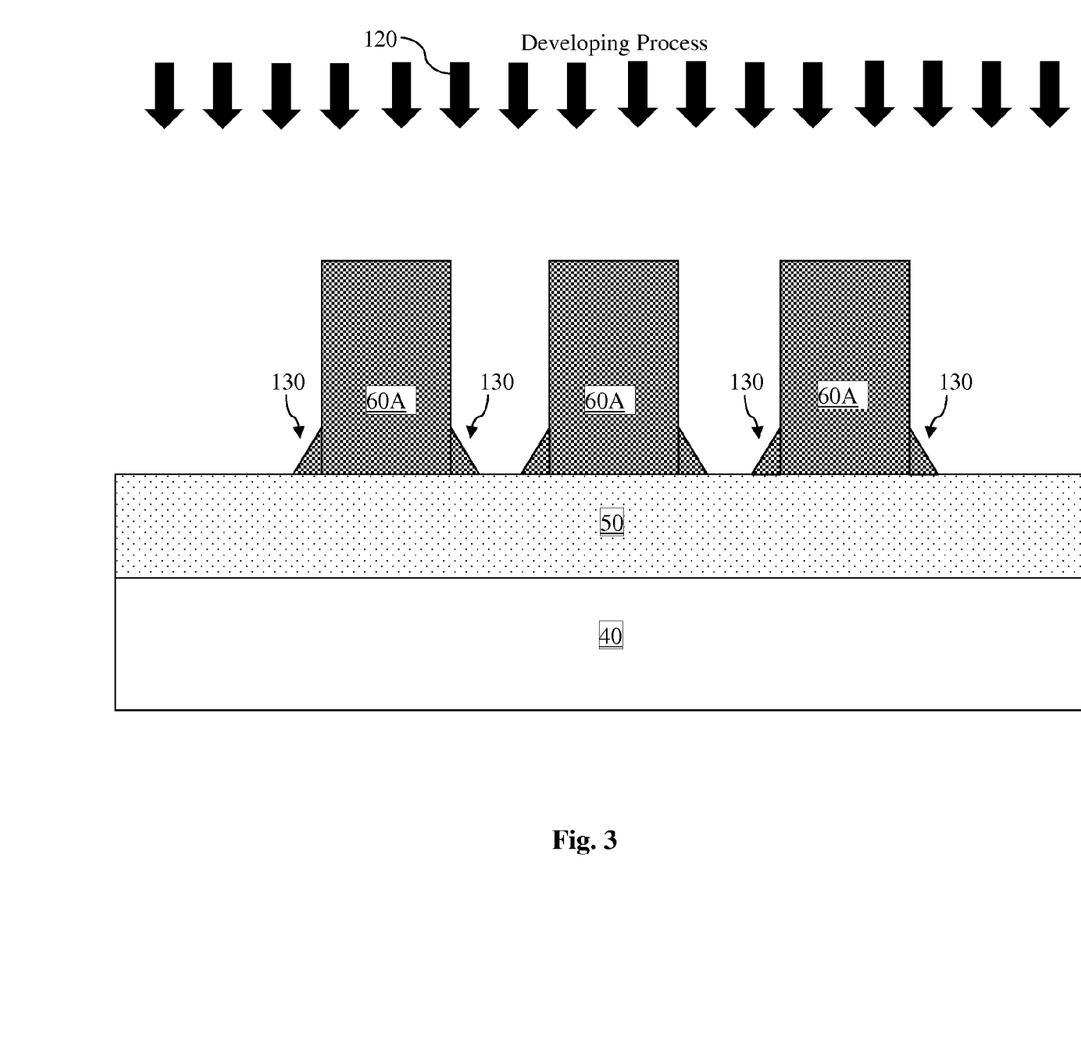

Referring now to FIG. 3, a developing process 120 is performed to develop the photoresist layer 60. A developer solution is applied to the photoresist layer 60 as a part of the developing process 120. In some embodiments, the developer solution includes n-butyl acetate (n-BA). As is shown in FIG. 3, the developer solution washes away the portions of the photoresist layer 60 that are not exposed to the UV light 80, but the portions 60A of the photoresist layer 60 exposed to the UV light 80 still remains.

However, photoresist scum 130 (also referred to as photoresist residue or blind) may still remain at the bottom of the photoresist portions 60A. The presence of the photoresist scum 130 may be due to the increased acidity of the material layer 50 (i.e., the Si-HM). In more detail, in an NTD process, the acidity of the material layer 50 is increased to improve the undercut profile issue (undercut profile issue caused by inadequate polarity change of photoresist bottom area). Unfortunately, some photoresist areas with poor optical contrast are too sensitive to acid from the material layer 50. These areas may then generate the photoresist scum 130 shown in FIG. 3. If not removed, the photoresist scum 130 may adversely affect the patterning accuracy of the material layer 50. In other words, the material layer 50 may not be able to achieve its desired pattern shape due to the presence of the photoresist scum 130.

Figure 4:
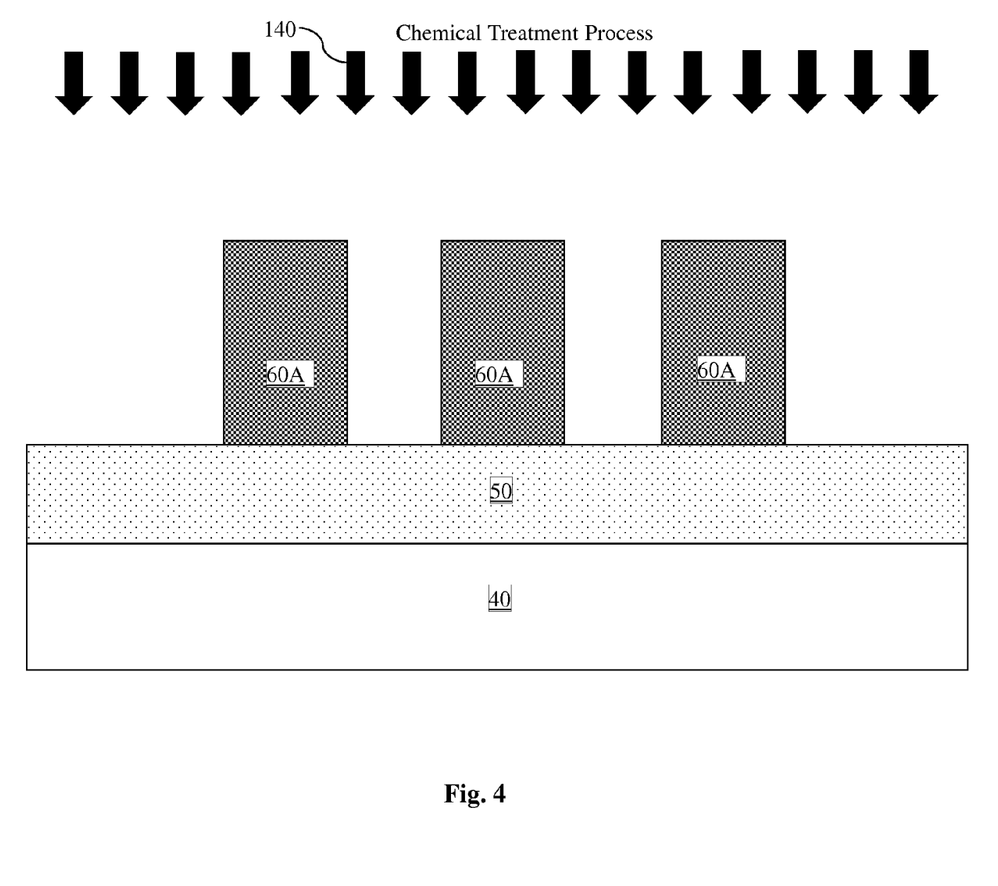

To facilitate the removal of the photoresist scum 130, the present disclosure applies a chemical treatment process 140 to the photoresist scum 130, as shown in FIG. 4. A solvent (or chemical) is used to rinse the photoresist scum 130 as a part of the chemical treatment process 140. The solvent has high polarity. In some embodiments, the solvent has a dipole moment higher than n-BA, for example the dipole moment of the solvent may be greater than about 1.9 D. The solvent is a chemical interaction force that is capable of removing the photoresist scum 130 and/or curing the other issues of NTD process discussed above, such as DOF enlargement, diminished end-to-end distance, or line width roughness (LWR).

It is understood that the solvent may be a pure solvent or a co-solvent with n-BA. In embodiments where the solvent is a co-solvent with n-BA, the n-BA ratio in the combined solvent is greater than about 10%, otherwise the photoresist portions 60A may be at least partially dissolved, which is undesirable as that would also adversely impact the subsequent patterning of the material layer 50. It is also understood that if the solvent is a co-solvent with n-BA, they may be mixed together at a photoresist coating tool (e.g., track). In other words, the chemical material of the solvent need not necessarily be premixed with the n-BA. Instead, the chemical material of the solvent may be mixed with the n-BA using a standard coating tool for applying the developer solution during the actual fabrication of the semiconductor device 35. The mixing ratio of the solvent and the n-BA may be controlled by the coating tool, or with the coating recipe. In this manner, the present disclosure does not require complicated additional fabrication steps, since existing fabrication equipment (e.g., the coating tool/track herein) may be easily leveraged.

According to the various aspects of the present disclosure, there are several designs for the solvent. In a first design, the solvent contains chemical A. In some embodiments, the chemical A is propylene glycol monomethyl ether (PGME). In other embodiments, the chemical A is OK73, which is about 70% PGME and about 30% propylene glycol methyl ether acetate (PGMEA). In other words, the PGME/PGMEA has a 70/30 concentration percentage in OK73. The chemical A can dissolve (and thereby remove) the photoresist scum 130.

In a second design, the solvent contains chemical B, which includes chemical A discussed above with an additive added thereto. Stated differently, the chemical B is a blend of chemical A and the additive. In more detail, although the chemical A discussed above can dissolve the photoresist scum 130 well, the high polarity of the chemical A may cause photoresist film thickness loss, which is undesirable. To ease this concern, the additive is added herein as a part of chemical B in order to decrease photoresist film loss and increase contrast.

In some embodiments, the additive includes amine derivatives NR1R2R3, wherein R1, R2, R3 may be the same or different materials. R1, R2, and R3 may each represent a hydrogen atom, an alkyl group (e.g., an alkyl group having a carbon number of 1 to 20), a cycloalkyl group (e.g., a cycloalkyl group having a carbon number of 3 to 20), or an aryl group (e.g., an aryl group having a carbon number of 6 to 20). In some embodiments, R2 and R3 may combine with each other to form a ring. In some embodiments, the alkyl group having a substituent may be an aminoalkyl group having a carbon number of 1 to 20, a hydroxylalkyl group having a carbon number of 1 to 20, or cyanoalkyl group having a carbon number of 1 to 20. In some embodiments, the structure for the additive includes guanidine, aminopyrrolidine, pyrazole, pyazoline, piperazine, aminomorpholine, aminialkylmorpholine, or piperidine. In some embodiments, the additive in chemical B can also be photo-sensitive or thermal-sensitive to change its PH value.

In a third design, the solvent contains chemical C. Similar to chemical B, the chemical C includes an additive that is blended to chemical A to ease the photoresist film thickness loss concerns. Unlike chemical B, however, the chemical C does not contain the amine derivatives NR1R2R3 but rather contains triphenylsulfonium (TPS) salt derivatives. In some embodiments, the additive in chemical C can also be photo-sensitive or thermal-sensitive to change its PH value.

It is understood that the second design (chemical B) or the third design (chemical C) are optional, and that they may not be needed if the first design (chemical A) is capable of removing the photoresist scum 130 without degrading the desired photoresist pattern formed by the photoresist portions 60A. Regardless of which design is used for the solvent, the end result is that the photoresist scum 130 is removed by the chemical treatment process 140, while the desired photoresist portions 60A still remain.

It is understood that some standard lithography processes may be performed but are not specifically discussed herein for reasons of clarity and simplicity. For example, a hard bake process may be performed after the developing process 120 but before the chemical treatment process 140. In addition, the process flow discussed above with reference to FIGS. 1-4 shows the chemical treatment process 140 being performed after the "standard" developing process 120 using n-BA as a developer. However, it is understood that the order in which the processes 120 and 140 are performed is not critical. In some alternative embodiments, the chemical treatment process 140 may be performed before the developing process 120. It some other alternative embodiments, the processes 120 and 140 may also be performed together or simultaneously. In other words, the solvent (using either chemical A, chemical B, or chemical C) and the n-BA developer may be applied to the photoresist layer 60 at the same time.

After the developing process 120 and the chemical treatment process 140 are performed, subsequent patterning processes may be performed using the patterned photoresist as a mask. For example, the material layer 50 (e.g., Si-HM) may be patterned into a mask layer to further pattern the layers therebelow. The patterned photoresist may be removed by a photoresist removal process known in the art, such as a stripping or an ashing process.

Figure 5:
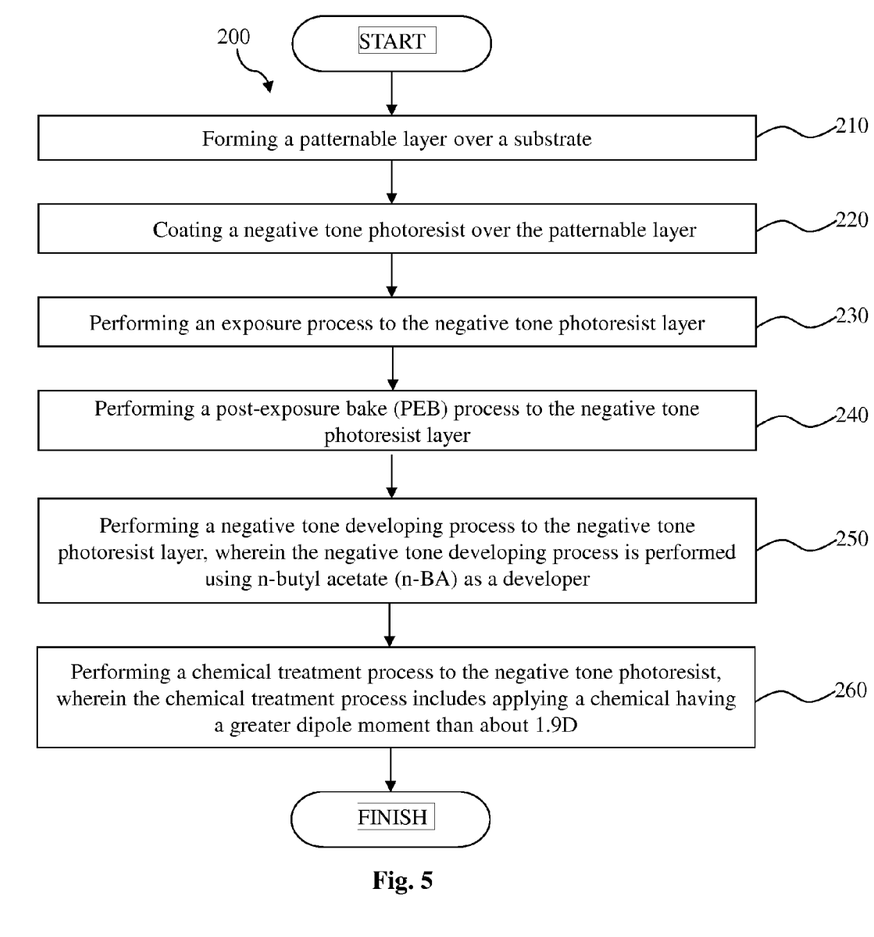
FIG. 5 is a flowchart illustrating a method of fabricating a semiconductor device in accordance with some embodiments of the present disclosure.

FIG. 5 is a flowchart of a method 200 of forming a semiconductor pattern according to various aspects of the present disclosure. The method 200 may be performed as a part of a lithography process.

The method 200 includes a step 210 of forming a patternable layer over a substrate. In some embodiments, the substrate is substantially conductive or semi-conductive. In some embodiments, the substrate contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 40 may contain Ti, Al, Co, Ru, TiN, WN2, or TaN. In some other embodiments, the substrate contains a dielectric material with a dielectric constant in a range from about 1 to about 40. In some other embodiments, the substrate contains Si, metal oxide, or metal nitride, where the formula is $MX_b$, wherein M is a metal or Si, and X is N or O, and wherein "b" is in a range from about 0.4 to 2.5. For example, the substrate may contain $SiO_2$, silicon nitride, aluminum oxide, hafnium oxide, or lanthanum oxide.

The patternable layer formed over the substrate has different optical properties than photoresist. For example, the layer has a different n, k, or T value from photoresist. In some embodiments, the layer comprises at least one of different polymer structure, acid labile molecule, PAG (photo acid generator) loading, quencher loading, chromophore, cross linker, or solvent, which lead to different n value to photoresist. In some embodiments, the layer and photoresist have different etching resistance. In some embodiments, the layer contains an etching resistant molecule. The molecule includes low onishi number structure, double bond, triple bond, silicon, silicon nitride, Ti, TiN, Al, aluminum oxide, SiON, or combinations thereof. It is understood that additional layers may be formed between the patternable layer and the substrate.

The method 200 includes a step 220 of coating a negative tone photoresist layer over the layer.

The method 200 includes a step 230 of performing an exposure process to the negative tone photoresist layer.

The method 200 includes a step 240 of performing a post-exposure bake (PEB) process to the negative tone photoresist layer.

The method 200 includes a step 250 of performing a negative tone developing process to the negative tone photoresist layer. The negative tone developing process is performed using n-butyl acetate (n-BA) as a developer in some embodiments.

The method 200 includes a step 260 of performing a chemical treatment process to the negative tone photoresist. The chemical treatment process includes applying a chemical having a greater dipole moment than about 1.9 D. The chemical contains propylene glycol monomethyl ether acetate (PGMEA) or a combination of propylene glycol monomethyl ether (PGME) and PGMEA (e.g., OK73).

In some embodiment, the chemical of step 260 is applied as a part of a solvent, where the solvent may also include n-BA. A ratio of the n-BA in the solvent is greater than about 10%.

In some embodiments, the chemical of step 260 further contains an additive. The additive may include amine derivatives NR1R2R3. R1, R2, and R3 may each represent a hydrogen atom, an alkyl group (e.g., an alkyl group having a carbon number of 1 to 20), a cycloalkyl group (e.g., a cycloalkyl group having a carbon number of 3 to 20), or an aryl group (e.g., an aryl group having a carbon number of 6 to 20). In some embodiments, R2 and R3 may combine with each other to form a ring. In some embodiments, the alkyl group having a substituent may be an aminoalkyl group having a carbon number of 1 to 20, a hydroxylalkyl group having a carbon number of 1 to 20, or cyanoalkyl group having a carbon number of 1 to 20. In some embodiments, the structure for the additive includes guanidine, aminopyrrolidine, pyrazole, pyazoline, piperazine, aminomorpholine, aminialkylmorpholine, or piperidine.

In some other embodiments, the additive may also include triphenylsulfonium (TPS) salt derivatives.

In some embodiments, the additive is photo-sensitive or thermal-sensitive to change its PH value.

It is understood that the steps 250 and 260 need not be performed sequentially. In some embodiments, the negative tone developing process in step 250 is performed before the chemical treatment process in step 260. In some other embodiments, the negative tone developing process in step 250 is performed after the chemical treatment process in step 260. In yet other embodiments, the negative tone developing process in step 250 and the chemical treatment process in step 260 may be performed together or simultaneously.

It is also understood that additional processes may be performed before, during, or after the steps 210-260 of the method 200 to complete the fabrication of the semiconductor device. For example, the method 200 may include additional processes to pattern the patternable layer, and using the patternable layer as a mask to pattern layers therebelow. As another example, the exposure process discussed herein may be done using a radiation having a first wavelength, and the photoresist may later be exposed by a radiation having a second wavelength (e.g., as a part of a double patterning process). For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the chemical treatment process discussed above can sufficiently and effectively remove photoresist scum that is generated as a part of a NTD process. As a result, the photoresist pattern has a more clearly and precisely defined profile, and issues plaguing NTD processes such as narrow DOF, poor LWR, etc., may disappear. This allows the NTD lithography to achieve smaller device sizes. Another advantage is that the solvent used in the chemical treatment may be applied via existing coating tools. Therefore, the processes of the present disclosure are compatible with existing process flow and do not significantly increase fabrication costs or time.

One embodiment of the present disclosure pertains to a method of fabricating a semiconductor device. A material layer is formed over a substrate. A negative tone photoresist layer is coated over the material layer. An exposure process is performed to the negative tone photoresist layer. A post-exposure bake (PEB) process is performed to the negative tone photoresist layer. After the exposure process and the PEB process, the negative tone photoresist layer is treated with a solvent. The solvent contains a chemical having a greater dipole moment than n-butyl acetate (n-BA).

Another embodiment of the present disclosure pertains to a method of fabricating a semiconductor device. A patternable layer is formed over a substrate. A negative tone photoresist layer is formed over the patternable layer. An exposure process is performed to the negative tone photoresist layer. A post-exposure bake (PEB) process is performed to the negative tone photoresist layer. A negative tone developing process is performed to the negative tone photoresist layer. The negative tone developing process is performed using n-butyl acetate (n-BA) as a developer. A chemical treatment process is performed to the negative tone photoresist. The chemical treatment process includes applying a chemical having a greater dipole moment than about 1.9 D. The chemical contains propylene glycol monomethyl ether acetate (PGMEA) or a combination of propylene glycol monomethyl ether (PGME) and PGMEA. The chemical treatment process may be performed before, during, or after the negative tone developing process.

Yet another embodiment of the present disclosure pertains to a method of fabricating a semiconductor device. A material layer is formed over a substrate. A negative tone photoresist layer is coated over the material layer. An exposure process is performed to the negative tone photoresist layer. A post-exposure bake (PEB) process is performed to the negative tone photoresist layer. A negative tone developing process is performed to the negative tone photoresist layer. The negative tone developing process is performed using n-butyl acetate (n-BA) as a developer. The negative tone photoresist layer is treated with a solvent. The solvent contains a chemical and an additive. The chemical contains propylene glycol monomethyl ether acetate (PGMEA) or a mix of propylene glycol monomethyl ether (PGME) and PGMEA with about a 70/30 concentration percentage. The additive contains amine derivatives or triphenylsulfonium (TPS) salt derivatives.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a material layer over a substrate, wherein the material layer has an acidity;
    coating a negative tone photoresist layer over the material layer;
    performing an exposure process to the negative tone photoresist layer;
    performing a post-exposure bake (PEB) process to the negative tone photoresist layer;
    developing the negative tone photoresist layer after the PEB process, wherein photoresist scum remains at a bottom of a developed negative tone photoresist layer, wherein the photoresist scum is produced due to a sensitivity of the negative tone photoresist layer to the acidity of the material layer; and
    removing the photoresist scum from the developed negative tone photoresist layer using a solvent, wherein the solvent contains a chemical having a greater dipole moment than n-butyl acetate (n-BA).

2. The method of claim 1, wherein the chemical contains at least one of: propylene glycol monomethyl ether (PGME) and propylene glycol monomethyl ether acetate (PGMEA).

3. The method of claim 1, wherein the solvent further contains n-BA, wherein a ratio of the n-BA in the solvent is greater than about 10%.

4. The method of claim 1, wherein the solvent further contains an additive.

5. The method of claim 4, wherein the additive includes amine derivatives NR1R2R3, wherein R1, R2, and R3 may each represent a hydrogen atom, an alkyl group, a cycloalkyl group, or an aryl group.

6. The method of claim 5, wherein R2 and R3 combine with each other to form a ring.

7. The method of claim 4, wherein the additive includes triphenylsulfonium (TPS) salt derivatives.

8. The method of claim 4, wherein the additive is photo-sensitive or thermal-sensitive.

9. The method of claim 1, further comprising: performing a negative tone development process to the negative tone photoresist layer.

10. The method of claim 9, wherein the negative tone development process is performed using n-BA as a developer.

11. The method of claim 9, wherein the negative tone development process is performed before the removing of the photoresist scum.

12. The method of claim 9, wherein the negative tone development process is performed after the removing of the photoresist scum.

13. The method of claim 9, wherein the negative tone development process and the removing of the photoresist scum are performed simultaneously.

14. A method of fabricating a semiconductor device, comprising:
    forming a patternable layer over a substrate, the patternable layer being a non-photosensitive layer and has an acidity;
    forming a negative tone photoresist layer over the patternable layer;
    performing an exposure process to the negative tone photoresist layer;
    performing a post-exposure bake (PEB) process to the negative tone photoresist layer;
    performing a negative tone developing process to the negative tone photoresist layer, wherein the negative tone developing process is performed using n-butyl acetate (n-BA) as a developer, and wherein a photoresist scum is produced due to a sensitivity of the negative tone photoresist layer to the acidity of the patternable layer, and wherein the photoresist scum remains at a bottom of a developed negative tone photoresist layer after the negative tone developing process has been performed; and
    performing a chemical treatment process to the developed negative tone photoresist layer to remove the photoresist scum by applying a chemical having a greater dipole moment than about 1.9D, wherein the chemical contains propylene glycol monoinethyl ether acetate (PGMEA) or a combination of propylene glycol monomethyl ether (PGME) and PGMEA, and wherein the chemical treatment process is performed after the negative tone developing process.

15. The method of claim 14, wherein the chemical further contains amine derivatives or triphenylsulfonium (TPS) salt derivatives.

16. The method of claim 15, wherein the amine derivatives include NR1R2R3, wherein R1, R2, and R3 may each represent a hydrogen atom, an alkyl group, a cycloalkyl group, or an aryl group.

17. The method of claim 16, wherein R2 and R3 combine with each other to form a ring.

18. The method of claim 15, wherein the chemical is photo-sensitive or thermal-sensitive.

19. A method of fabricating a semiconductor device, comprising:
    forming a dielectric material layer over a substrate, the dielectric material layer being non-photosensitive and contains an acid;
    coating a negative tone photoresist layer over the dielectric material layer;
    performing an exposure process to the negative tone photoresist layer;
    performing a post-exposure bake (PEB) process to the negative tone photoresist layer;
    performing a negative tone developing process to the negative tone photoresist layer, wherein the negative tone developing process is performed using n-butyl acetate (n-BA) as a developer, and wherein the negative tone developing process leaves photoresist scum at a bottom of a developed negative tone photoresist layer as a result of a reaction between the dielectric material layer and portions of the photoresist layer that are sensitive to the acid of the dielectric material layer; and
    removing the photoresist scum by treating the developed negative tone photoresist layer with a solvent, wherein the solvent contains a chemical and an additive;
    wherein:
    the chemical contains propylene glycol inonomethyl ether acetate (PGMEA) or a mix of propylene glycol monomethyl ether (PGME) and PGMEA with about a 70/30 concentration percentage, and
    the additive contains amine derivatives or triphenylsulfonium (TPS) salt derivatives.

20. The method of claim 19, wherein amine derivatives include NR1R2R3, wherein R1, R2, and R3 may each represent a hydrogen atom, an alkyl group, a cycloalkyl group, or an aryl group.

* * * * *